United States Patent
Lee et al.

(10) Patent No.: US 6,703,314 B2
(45) Date of Patent: Mar. 9, 2004

(54) METHOD FOR FABRICATING SEMICONDUCTOR DEVICE

(75) Inventors: Sung-Kwon Lee, Ichon-shi (KR); Sang-Ik Kim, Ichon-shi (KR); Chang-Youn Hwang, Ichon-shi (KR); Weon-Joon Suh, Ichon-shi (KR); Min-Suk Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/308,139

(22) Filed: Dec. 3, 2002

(65) Prior Publication Data

US 2003/0113993 A1 Jun. 19, 2003

(30) Foreign Application Priority Data

Dec. 14, 2001 (KR) .................................. 2001-0079250

(51) Int. Cl.[7] ............................................. H01L 21/302
(52) U.S. Cl. ................ 438/700; 438/697; 438/699; 438/743; 438/734; 438/750; 438/299; 438/303
(58) Field of Search .................. 438/697, 699, 438/700, 743, 734, 750, 723, 756, 303, 305, 299

(56) References Cited

U.S. PATENT DOCUMENTS

| | | | | |
|---|---|---|---|---|
| 6,255,160 B1 | * | 7/2001 | Huang | 438/253 |
| 6,365,464 B1 | * | 4/2002 | Chiang et al. | 438/279 |
| 6,432,833 B1 | | 8/2002 | Ko | |
| 2001/0005614 A1 | * | 6/2001 | Kim et al. | 438/284 |
| 2001/0055867 A1 | * | 12/2001 | Lee | 438/586 |
| 2002/0034877 A1 | * | 3/2002 | Shin et al. | 438/694 |

FOREIGN PATENT DOCUMENTS

| JP | 06-053160 | * | 2/1994 |
|---|---|---|---|
| JP | 2000-049112 | | 2/2000 |
| JP | 2001-230387 | | 8/2001 |
| JP | 2002-110819 | | 4/2002 |

* cited by examiner

*Primary Examiner*—George Goudreau
(74) *Attorney, Agent, or Firm*—Jacobson Holman PLLC

(57) ABSTRACT

Provided is a method for forming a self aligned contact (SAC) of a semiconductor device that can minimize the loss of gate electrodes and hard mask. The method includes the steps of: providing a semiconductor substrate on which a plurality of conductive patterns are formed; forming a first insulation layer along the profile of the conductive patterns on the substrate; forming a second insulation layer on the substrate and simultaneously forming voids between the conductive patterns; forming a third insulation layer on the first insulation layer; and forming contact holes that expose the surface of the substrate between the conductive patterns by etching the third insulation layer and the second insulation layer covering the voids.

8 Claims, 3 Drawing Sheets

US 6,703,314 B2

METHOD FOR FABRICATING SEMICONDUCTOR DEVICE

FIELD OF THE INVENTION

The present invention relates to a method for forming a self aligned contact (SAC) of a semiconductor device; and, more particularly, to a method for forming an SAC that improves the margin of the SAC forming process by forming voids.

DESCRIPTION OF RELATED ART

Even though the integration of a semiconductor device is increased, it is very hard to safely secure overlay accuracy and the margin of a pattern forming process that uses a photoresist. Therefore, a self aligned contact (SAC) process is developed to solve this problem. The SAC process does not uses any separate mask in the patterning and performs etching using a material that is deposited already, and thereby contributes to cost reduction. Various methods are used in the SAC process, but the most frequently used one is a method that uses a nitride layer as an etching barrier layer.

FIG. 1 is a cross-sectional view showing a process for forming an SAC using a nitride layer as an etching barrier layer according to a prior art. In the drawing, gate electrodes 11 are formed on a substrate 10, and spacers are formed on the sidewalls thereof, and an etching barrier layer formed of nitride, i.e., a hard mask 12, is formed on the gate electrodes to prevent the loss of the gate electrodes in the SAC forming process. On top of this structure, an inter-layer insulation layer 14 is deposited. The reference 'A' shows the loss of the gate electrode 11 and the hard mask 12 in the process for forming a contact plug, such as storage node or bit line. In the SAC forming process, etching is performed to the impurity junction area in the lower part of the substrate 10, and in this etching process, the loss marked as 'A' is inevitable.

In other words, in the etching process, over-etching should be performed to charge the underlying layer with electricity. Here, since the conductor layer in the upper part, such as gate electrodes 11, is open and continues to be attacked, the underlying layer is short-circuited from a conductive material, such as a subsequent plug, and thereby the electric characteristics of the semiconductor device are deteriorated, and the throughput is dropped as well. Therefore, to solve the above problems from the basics, the etching condition of high selection ratio should be developed, but this can hardly be realized.

SUMMARY OF THE INVENTION

It is, therefore, an object of the present invention to provide a method for forming a self aligned contact (SAC) of a semiconductor device that can minimize the loss of gate electrodes and hard mask as well as simplifies the SAC forming process.

In accordance with an aspect of the present invention, there is provided a method for forming an SAC of a semiconductor device, including the steps of: providing a semiconductor substrate on which a plurality of conductive patterns are formed; forming a first insulation layer along the profile of the conductive patterns on the substrate; forming a second insulation layer on the substrate and simultaneously forming voids between the conductive patterns; forming a third insulation layer on the first insulation layer; and forming contact holes that expose the surface of the substrate between the conductive patterns by etching the third insulation layer and the second insulation layer covering the voids.

In this method for forming an SAC of the present invention, a tetraethyl ortho silicate (TEOS) layer is deposited between the gate electrodes to prevent the loss of gate electrodes and hard mask. Here, the losses of gate electrodes and hard mask are prevented by forming voids to increase the etching margin in the subsequent SAC forming process.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

FIGS. 2A to 2D are cross-sectional view describing a process for forming a self aligned contact (SAC) of a semiconductor device in accordance with an embodiment of the present invention.

Figure 1:
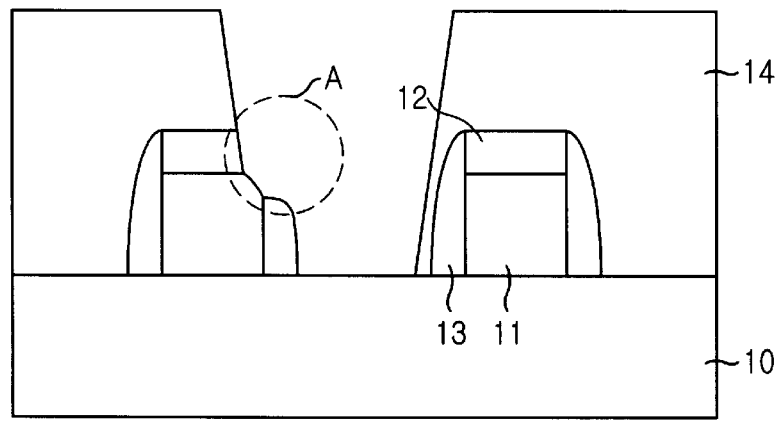
FIG. 1 is a cross-sectional view showing a process for forming a self-aligned contact (SAC) using a nitride layer as an etching barrier layer according to a prior art.
Figure 2A:
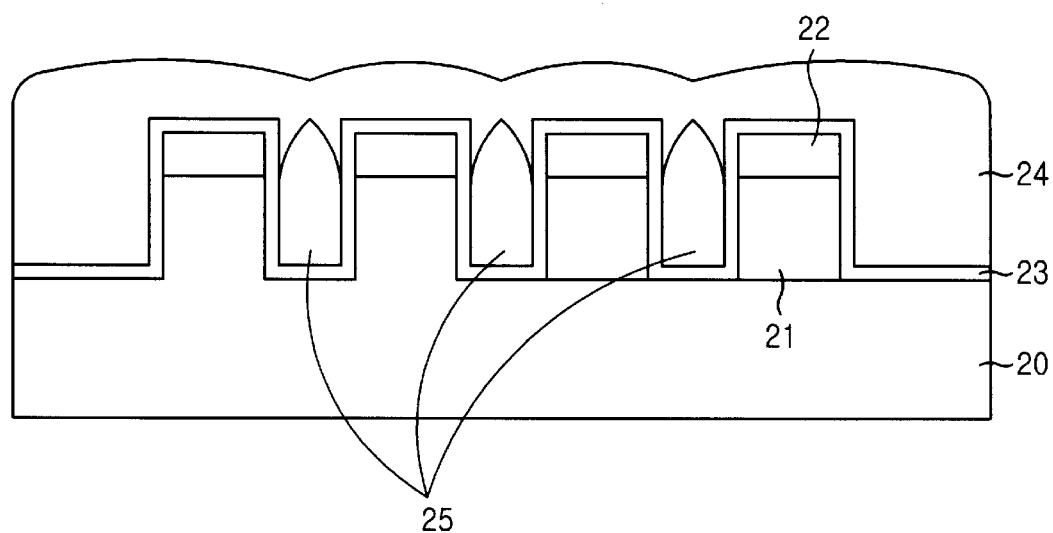
FIGS. 2A to 2D are cross-sectional view describing a process for forming an SAC of a semiconductor device in accordance with an embodiment of the present invention.

First, as shown in FIG. 2A, a plurality of conductive patterns are formed on a substrate 20 neighboring each other. On the substrate 20, various constituents for a semiconductor device were already formed, The conductive patterns include bit lines and gate electrodes. As an example of the conductive patterns, gate electrodes will be described, hereinafter.

A gate insulation layer (not shown) is formed of oxide, and a conductor layer for gate electrodes is formed on the gate insulation layer by depositing polysilicon, tungsten, or tungsten silicide, or depositing all of them one on the other. Then, a hard mask 22 formed of a silicon nitride layer or a silicon oxynitride layer is deposited thereon to a thickness of 2,000~8,000 Å, and photolithography is performed using the gate electrode as a mask to form gate electrodes 21.

Subsequently, an insulation layer 23 for spacers is formed to protect the sidewalls of the gate electrodes. Here, the insulation layer 23 for spacers is formed of a silicon nitride layer or a silicon oxynitride layer to a thickness of 100 to 1,000 Å.

Subsequently, a tetraethyl ortho silicate (TEOS) layer 24 is formed to fill in the space between the gate electrodes 21 on the insulation layer 23 for spacers sufficiently. Here, voids come to be formed between the gate electrodes 21 by performing the process under the conditions that deteriorate the gap-filling characteristics of the TEOS. To be more specific, TEOS deposited in a plasma-enhanced chemical vapor deposition (PCVD) method, which will be referred to as PE-TEOS herefrom, or TEOS deposited in a low pressure chemical vapor deposition method, which will be referred to as LP-TEOS herefrom, is deposited to a thickness of 2,000~8,000 Å. The voids 25 are formed easily, when this deposition is performed at a temperature of 400~600° C. under a pressure of 1~10 Torr, using reaction source containing $SiH_4$ whose flow rate is 100~500 SCCM, and $N_2O$ whose flow rate is 500~1000 SCCM, and RF power of 0.5~2.0 KW.

The voids 25 reduce the etching target in the subsequent SAC forming process, and increase the process margin thereby. Besides the TEOS, a high density plasma (HDP) oxide layer can be used.

Figure 2B:
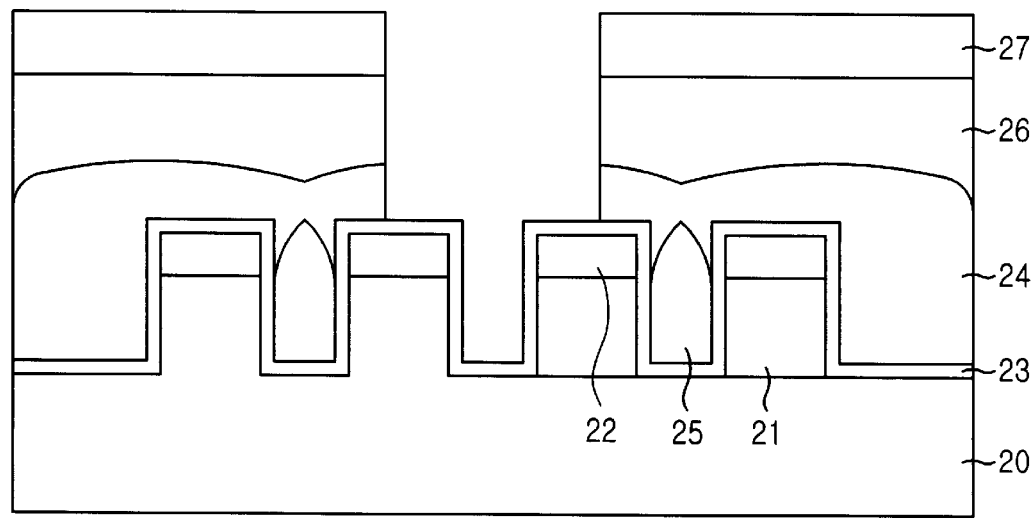

Subsequently, as illustrated in FIG. 2B, an insulation layer 26 formed of boro silicate glass (BSG), phopho silicate glass (PSG), BPSG, advanced planarization layer (APL) or HDP oxide, is deposited on the TEOS layer 24. Then, a photoresist pattern 27 is formed to form contacts on the insulation layer 26, and the insulation layer 26 and the TEOS layer 24 are etched to expose the insulation layer 23 for spacers by using the photoresist pattern 27 as an etching mask and performing a selective etching. Here, fluorine-based plasma gas used in an ordinary SAC forming process, such as $C_2F_4$, $C_2F_6$, $C_3F_8$, $C_4F_6$ or $C_5F_{10}$, is used as a main etching gas, and then gas for generating polymers in the SAC forming process, i.e., $CH_2F_2$, $C_3HF_5$, or $CHF_3$ is added thereto using inactive gas, such as He, Ne, Ar, or Xe as carrier gas.

Figure 2C:
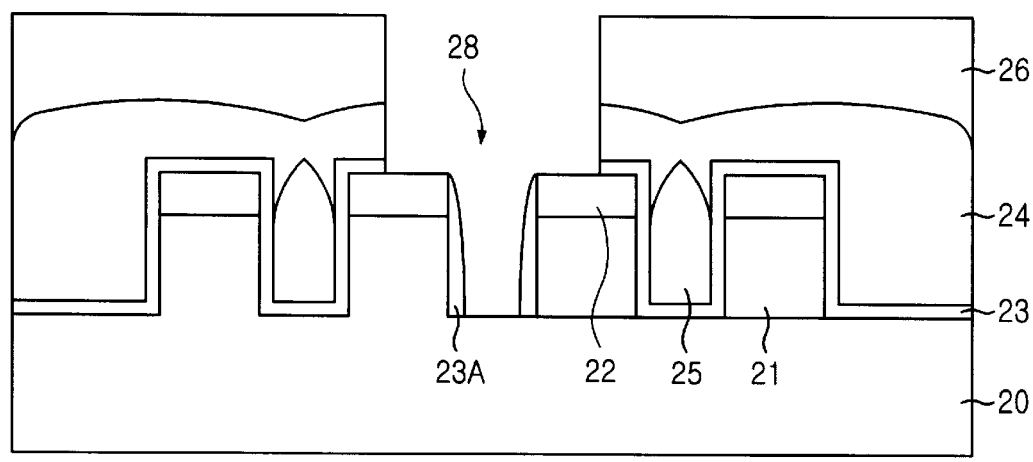

Subsequently, as illustrated in FIG. 2C, the contact holes 28 are formed to expose the surface of the substrate 20 by removing the insulation layer 23 for spacers. Here, in this sequential process for etching to form the contact holes 28, the insulation layer 23 for spacers may be etched out, still maintaining the photoresist pattern 27, or it may be removed by removing the photoresist pattern 27, capping the upper part of the gate electrode patterns with a material having bad gap-filling characteristic, such as undoped silicate glass (USG), and using the USG as an etching mask. In the mean time, since the critical dimension (CD) of the bottom surface of the contact holes 28 decreases due to the etching profile having a slant, it is desirable to secure the CD sufficiently at the bottom of the contact holes 28 using fluorine-based solution, and remove the insulation layer 23 for spacers.

Accordingly, when contact holes 28 are formed, the etching time and gas flow rate are decreased due to the voids 25, so the overall process margin become increased and thereby the losses of the gate electrodes 21 and hard mask 22 are minimized.

Figure 2D:
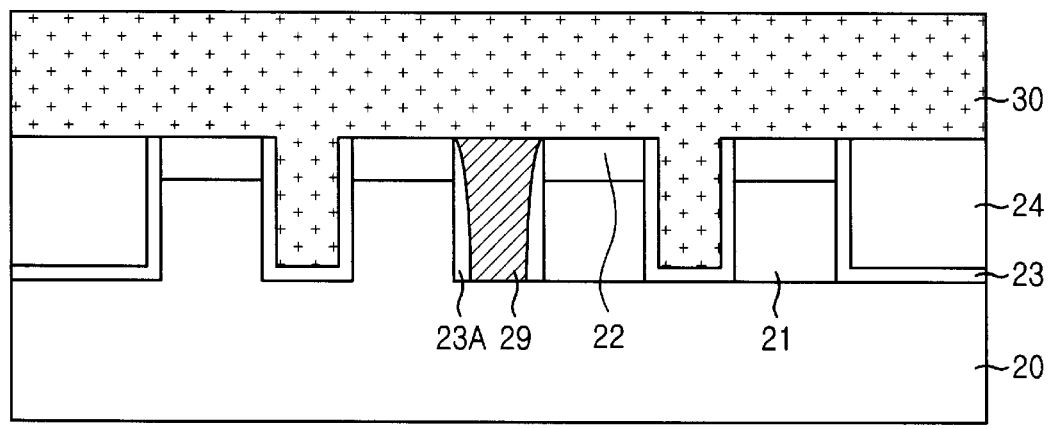

Subsequently, as shown in FIG. 2D, a material for plug 29, such as polysilicon, is deposited to fill in the contact holes 28, and then the planarization is carried out in a method, such as chemical mechanical polishing (CMP). Here, the polishing is performed until the hard mask is exposed.

Subsequently, an advanced planarization layer (APL) 30 is formed.

FIG. 2D shows the case that the TEOS layer 24 covering the voids 25 is removed, and thus the advanced planarization layer (APL) 30 fills the void between the gate electrodes.

Figure 3:
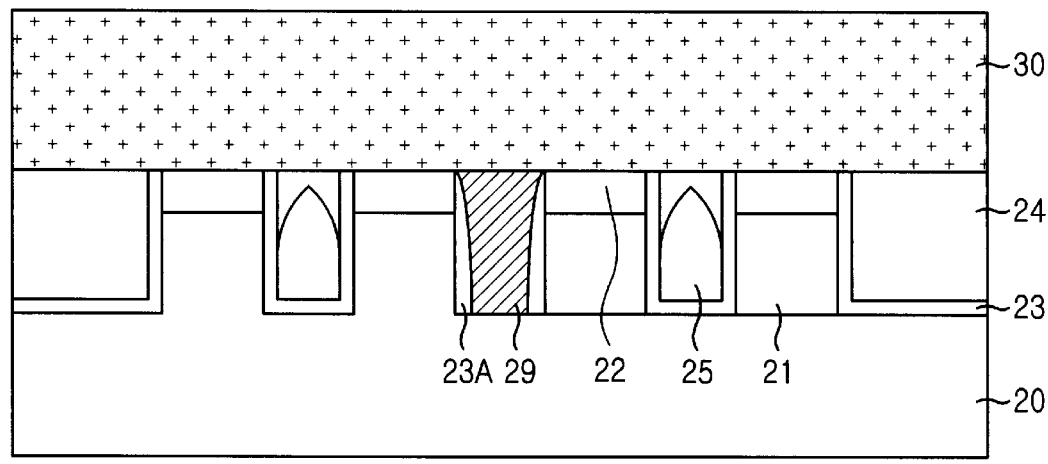
FIG. 3 is cross-sectional view describing a process for forming an SAC of a semiconductor device in accordance with another embodiment of the present invention.

FIG. 3 shows the case that the TEOS layer 24 covering the voids 25 is not removed, and thus the void is left between the gate electrodes.

From the embodiment of the present invention, it can be seen that voids are formed between the gate electrodes, in which the SAC will be formed, by using the TEOS layer with a low gap-filling characteristic, and thereby process margin is increased in the etching process for forming an SAC, and the loss of gate electrodes and hard mask is minimized. This advantages lead to a remarkable increase in the throughput of semiconductor devices.

While the present invention has been described with respect to certain preferred embodiments, it will be apparent to those skilled in the art that various changes and modifications may be made without departing from the scope of the invention as defined in the following claims. The mask used for forming contact holes in the embodiment described above may be a hole-type or line-type.

What is claimed is:

1. A method for forming a self aligned contact of a semiconductor device, comprising the steps of:

providing a semiconductor substrate on which a plurality of conductive patterns are formed;

forming a first insulation layer along the profile of the conductive patterns on the substrate;

forming a second insulation layer on the substrate and simultaneously forming voids between the conductive patterns;

forming a third insulation layer on the first insulation layer; and forming contact holes that expose the surface of the substrate between the conductive patterns by etching the third insulation layer and the second insulation layer covering the voids.

2. The method as recited in claim 1, wherein the second insulation layer is formed in a thickness of 2,000~8,000 Å.

3. The method as recited in claim 1, wherein the second insulation layer includes a PE-TEOS or an HDP oxide layer.

4. The method as recited in claim 1, wherein the step of forming the second insulation layer is performed at 400~600° C. under a pressure of 1~10 Torr.

5. The method as recited in claim 4, wherein in the step of forming the second insulation layer, reaction source contains $SiH_4$ whose flow rate is 100~500 SCCM, and $N_2O$ whose flow rate is 500~1,000 SCCM, and the RF power of 0.5~2.0 KW is used.

6. The method as recited in claim 3, wherein the first insulation layer is formed with a silicon nitride layer or silicon oxynitride layer.

7. The method as recited in claim 3, wherein the third insulation layer is formed of BSG, PSG, BPSG, APL or HDP oxide.

8. The method as recited in claim 1, further comprising a step of forming a plug in the contact hole.

* * * * *